United States Patent [19]

Ohbayashi et al.

[11] Patent Number: 4,977,337

[45] Date of Patent: Dec. 11, 1990

[54] BI-CMOS LOGIC CIRCUIT

[75] Inventors: Shigeki Ohbayashi; Katsushi Asahina, both of Hyogo, Japan

[73] Assignee: Mitsubishi Denki Kabushiki Kaisha, Tokyo, Japan

[21] Appl. No.: 462,378

[22] Filed: Jan. 9, 1990

[30] Foreign Application Priority Data

Jun. 13, 1989 [JP] Japan ................................ 1-150892

[51] Int. Cl.[5] .................... H03K 19/02; H03K 17/16; H03K 5/12

[52] U.S. Cl. .................................. 307/446; 307/443; 307/263; 307/570; 307/572; 307/270

[58] Field of Search .................... 307/296.3, 443, 446, 307/263, 570, 572, 270

[56] References Cited

U.S. PATENT DOCUMENTS 4,845,386 7/1989 Veno ................................ 307/446

FOREIGN PATENT DOCUMENTS 61-20426 7/1984 Japan .
61-54712 8/1984 Japan .
63-240125 3/1987 Japan .

OTHER PUBLICATIONS

Yoji Nishio et al., "A BiCMOS Logic Gate with Positive Feedback", *Digest of Technical Papers of* 1989 *IEEE International Solid-State Circuits Conference,* Feb. 16, 1989, pp. 116–117, 305.

A. Watanabe et al., "High Speed BiCMOS VLSI Technology With Buried Twin Well Structure", *Digest of Technical Papers of IEDM* 85, 1985, pp. 423–426.

*Primary Examiner*—Stanley D. Miller
*Assistant Examiner*—Margaret Rose Wambach
*Attorney, Agent, or Firm*—Lowe, Price, LeBlanc, Becker & Shur

[57] ABSTRACT

A Bi-CMOS logic circuit structured by bipolar transistors and insulated gate type transistors includes a first NPN bipolar transistor for charging an output node and a second NPN bipolar transistor for discharging the output node. The first bipolar transistor has a collector coupled to a first power supply and an emitter connected to the output node. The second bipolar transistor has a collector connected to the output node and an emitter coupled to a second power supply. The Bi-CMOS logic circuit also includes at least one P channel insulated gate type transistor provided between the first power supply and a base of the first bipolar transistor for receiving an input signal at its gate, and at least one N channel insulated gate type transistor provided between the output node and a base of the second bipolar transistor for receiving the input signal at its gate. The Bi-CMOS logic circuit further includes a third NPN bipolar transistor for drawing charges out of the base of the first bipolar transistor, and an impedance element for biasing the base of the second bipolar transistor relative to the second power supply. The third bipolar transistor has a collector connected to the base of the first bipolar transistor, a base connected to the base of the second bipolar transistor and an emitter connected to the second power supply. The impedance element includes a fourth N channel insulated gate type transistor having a gate connected to the output node, one conduction terminal connected to the respective bases of the second and third bipolar transistors, and other conduction terminal coupled to the second power supply.

9 Claims, 8 Drawing Sheets

OUTPUT LOAD 2.0 pF

R1 = 5 KΩ

MP20: W = 10 μm

MN20: W = 5 μm

PMOS L: 1.2 μm

NMOS L: 1.0 μm

MP10: W = 30 μm Q1: 1×12 μm²
MN11: W = 15 μm Q2: 1×12 μm²
MN12: W = 30 μm Q3: 1×2 μm²
MN13: W = 5 μm (EMITTER SIZE)

BI-CMOS LOGIC CIRCUIT

BACKGROUND OF THE INVENTION

1. Field of the Invention

The present invention relates generally to Bi-CMOS logic circuits comprising a bipolar transistor and an insulated gate type field effect transistor, and more particularly, to an improvement of a Bi-CMOS logic circuit structured with Bi-CMOS technique, that is, hybrid integration technique of integrating a bipolar transistor and an insulated gate type field effect transistor on the same substrate.

2. Description of the Background Art

In recent years, in order to effectively utilize low power consumption of an insulated gate type field effect transistor (referred to as MOS transistor hereinafter) and large current drivability and high speed operation of a bipolar transistor, a function circuit is formed by integrating a MOS transistor and a bipolar transistor on the same semiconductor substrate. A function circuit obtained by such a hybrid integration technique is referred to as a Bi-MOS circuit. Particularly, when comprising both a P channel MOS transistor and an n channel MOS transistor, it is referred to as a Bi-CMOS circuit.

FIG. 1 shows one example of a conventional Bi-CMOS logic circuit. The Bi-CMOS logic circuit shown in FIG. 1 is a three-input NAND circuit, and which is disclosed, for example, in Patent Laying Open No. 61-54712.

Referring to FIG. 1, the Bi-CMOS logic circuit comprises a first NPN bipolar transistor Q1 and a second NPN bipolar transistor Q2 for driving an output V0. A collector of the fist bipolar transistor Q1 is coupled to receive a first power supply $V_{CC}$, and an emitter thereof is connected to the output V0. P channel MOS transistors (referred to as PMOS transistor hereinafter) MP1, MP2 and MP3 are connected in parallel between the collector and a base of the bipolar transistor Q1. Gates of the PMOS transistors MP1, MP2 and MP3 are coupled to inputs VI1, VI2 and VI3, respectively. N channel MOS transistors (referred to as NMOS transistor hereinafter) MN1, MN2 and MN3 are connected in series between the base of the bipolar transistor Q1 and a second power supply $V_{EE}$. Gates of the NMOS transistors MN1, MN2 and MN3 are connected to the inputs VI1, VI2 and VI3, respectively.

The second bipolar transistor Q2 for driving an output has its collector connected to the output V0 and its emitter connected to the power supply $V_{EE}$. NMOS transistors MN4, MN5 and MN6 are connected in series between the collector and a base of the bipolar transistor Q2. An NMOS transistor MN7 is connected between the base and an emitter of the bipolar transistor Q2. Gates of the NMOS transistors MN4, MN5 and MN6 are connected to the inputs VI1, VI2 and VI3, respectively. A gate of the NMOS transistor MN7 is connected to the base of the bipolar transistor Q1. Now, an operation thereof will be described.

When at least one of the inputs VI1–VI3 is at the "L" (logical low) level, the output V0 rises to the "H" (logical high) level. At this time, at least one of the MP1–MP3 is turned on, while at least one of the NMOS transistors MN1–MN3 is turned off, whereby the base of the bipolar transistor Q1 is coupled to the power supply $V_{CC}$ through a PMOS transistor in on state. As a result, the base potential of the bipolar transistor Q1 rises, so that the transistor Q1 is turned on.

On the other hand, under this condition, at least one of the NMOS transistors MN4–MN6 is turned off, and the NMOS transistor MN7 is turned on in response to the rise of the base potential of the bipolar transistor Q1. Accordingly, a base potential of the bipolar transistor Q2 is discharged through the NMOS transistor MN7 in on state, so that the bipolar transistor Q2 is turned off. As a result, the output V0 is charged through the bipolar transistor Q1, so that the output V0 rises to the "H" level.

When all of the inputs VI1–VI3 are at the "H" level, the output V0 falls to the "L" level. In this state, all of the PMOS transistors MP1–MP3 are turned off, and all of the NMOS transistors MN1–MN3 are turned on. As a result, the base potential of the bipolar transistor Q1 is discharged through the NMOS transistors MN1–MN3 to fall, so that the bipolar transistor Q1 is turned off. On the other hand, all of the NMOS transistors MN4–MN6 are turned on, and the NMOS transistor MN7 is turned off in response to the fall of the base potential of the bipolar transistor Q1. Accordingly, the base potential of the bipolar transistor Q2 rises by the charging from the output V0, so that the bipolar transistor Q2 is turned on. As a result, the output V0 is discharged through the bipolar transistor Q2, so that its potential falls.

In a structure of a conventional Bi-CMOS logic circuit, since the gates of the NMOS transistors MN1–MN3 for drawing out base charge of the bipolar transistor Q1 are connected to respective input terminals, an input capacitance is increased so that a load to a driving circuit in a preceding stage is increased. When the input capacitance is thus increased, much time is required to establish an output of the driving circuit (input of a Bi-CMOS logic circuit), thereby making a logical operation at a high speed impossible. In addition, in order to drive such a large input capacitance at a high speed, the driving circuit has to be made large in scale.

In case of such a multi-input logic circuit as shown in FIG. 1, a plurality of transistors are needed for drawing out base charge of the bipolar transistor Q1, so that the number of component elements and a layout area are increased, which prevents high integration. In order to remove a drawback of such a logic circuit, a structure is proposed in which the number of components and an input capacitance are reduced.

FIG. 2 shows a structure of another conventional Bi-CMOS logic circuit. The Bi-CMOS logic circuit shown in FIG. 2 is a three-input NAND circuit, which is disclosed in Japanese Patent Laying-Open No. 63-240125. In FIG. 2, the same reference numerals are allotted to the corresponding portions to those in the circuit structure shown in FIG. 1. In a circuit structure of FIG. 2, an NMOS transistor MN8 is disposed between the base of the bipolar transistor Q1 for driving an output and the second power supply $V_{EE}$. A gate of the NMOS transistor MN8 is connected to the base of the second bipolar transistor Q2 for driving an output. More specifically, a single NMOS transistor MN8 is employed for drawing out a base charge of the bipolar transistor Q1. Now, the operation thereof will be described.

In a structure shown in FIG. 2 as well, the output V0 rises from the "L" level to the "H" level, if at least one of the inputs VI1–VI3 is at the "L" level. In this state, at least one of the PMOS transistors MP1–MP3 is turned on. Before a potential of the output V0 rises, a base potential of the bipolar transistor Q1 is approximately at the "L" level, and the NMOS transistor MN7 is turned off and a base potential of the bipolar transistor Q2 is approximately the same as that of the output V0. Thus, the NMOS transistor MN8 is turned off. Subsequently, the base of the bipolar transistor Q1 is coupled to receive the power supply $V_{CC}$ through a PMOS transistor in on state, so that the potential thereat rises and the bipolar transistor Q1 is turned on, whereby the output V0 is charged from the power supply $V_{CC}$.

At this time, since at least one of the NMOS transistors MN4–MN6 is turned off when the base potential of the bipolar transistor Q1 rises, the NMOS transistor MN7 is turned on correspondingly. Thereby, the base potential of the bipolar transistor Q2 is discharged through the NMOS transistor MN7 in on state, so that the bipolar transistor Q2 is turned off. As a result, the output V0 is charged by the bipolar transistor Q1 to rise to the "H" level.

The output V0 falls from the "H" level to the "L" level, when all of the inputs VI1–VI3 are set at the "H" level. At this time, all of the PMOS transistors MP1–MP3 are turned off, while all of the NMOS transistors MN4–MN6 are turned on. As a result, the base potential of the bipolar transistor Q2 is charged from the output V0 through the NMOS transistors MN4–MN6 in on state, causing the base potential of the bipolar transistor Q2 to rise. Thus, the NMOS transistor MN8 is turned on to fall the base potential of the bipolar transistor Q1, so that the transistor Q1 is turned off. On the other hand, the NMOS transistor MN7 is turned off in response to both the rise of the base potential of the bipolar transistor Q2 and the fall of the base potential of the bipolar transistor Q1. As a result, the output V0 is discharged through the bipolar transistor Q2 in on state to fall to the "L" level.

In a structure of the above described another conventional Bi-CMOS logic circuit, only a single NMOS transistor MN8 is provided as a transistor for sinking out base charge of the bipolar transistor Q1, and the circuit may reduce an input capacitance, the number of elements and a layout area.

However, when the output VO falls in that circuit, the base potential of the bipolar transistor Q2 becomes lower than the output VO by the amount of on-resistances of the NMOS transistors MN4–MN6, and the NMOS transistor MN8 can not be deeply turned on. Therefore, it requires much time for the base potential of the bipolar transistor Q1 to fall, which delays turn off of the bipolar transistor Q1 and NMOS transistor MN7. As a result, the switching speed of the circuit is reduced.

In addition, when the bipolar transistor Q1 is delayed in turn off, the output VO falls slowly. If the output VO falls slowly (i.e. the falling time period thereof becomes longer), the base potential of the bipolar transistor Q2 falls slowly and a time period when the bipolar transistor Q1 and the bipolar transistor Q2 are simultaneously turned on becomes longer. In this case, a current flows from the power supply $V_{CC}$ to the another power supply $V_{EE}$, so that a power consumption is increased. The reduction of the switching speed and the increase of the power consumption are especially acute when the threshold voltage $V_{th}$ of the NMOS transistors is larger and the power supply voltage $V_{EE}$ is smaller.

Other structures of a Bi-CMOS logic gate circuit are disclosed in Japanese Patent Laying-Open No. 61-20426. This prior art reference discloses a logic gate circuit comprising a P channel MOS transistor having a source connected to a base of an NPN bipolar transistor for charging an output terminal, a drain connected to the output terminal, and a gate connected to an emitter of the NPN bipolar transistor for discharging the output.

SUMMARY OF THE INVENTION

An object of the present invention is to provide an improved Bi-CMOS logic circuit in which drawbacks of conventional Bi-CMOS logic circuits are removed.

Another object of the present invention is to provide a Bi-CMOS logic circuit having a reduced input capacitance and an excellent input/output response.

A further object of the present invention is to provide a Bi-CMOS logic circuit having the reduced number of components and reduced layout area.

Still another object of the present invention is to provide a Bi-CMOS logic circuit of low power consumption.

A Bi-CMOS logic circuit according to the present invention comprises a bipolar transistor as means for drawing out base charge of a bipolar transistor used for charging an output terminal. A base of the drawing bipolar transistor is connected to a base of a bipolar transistor for discharging an output terminal. More specifically, a Bi-CMOS logic circuit according to the present invention comprises a first bipolar transistor of a first conductivity type having a first conduction terminal connected to receive a first power supply, a second conduction terminal connected to an output terminal and a control terminal, a second bipolar transistor of the first conductivity type having a first conduction terminal connected to the output terminal, a second conduction terminal connected to receive a second power supply and a control terminal, at least one of MOS transistors of the first conductivity type connected between a base of the second bipolar transistor and the first power supply, for receiving an input signal at the gate thereof, at least one of MOS transistors of a second conductivity type connected between the first conduction terminal and the control terminal of the second bipolar transistor, for receiving an input signal at its gate, impedance means disposed between the control terminal and the second conduction terminal of the second bipolar transistor, for setting a potential of the control terminal of the second bipolar transistor to a second power supply potential when the first bipolar transistor is made conductive, and a third bipolar transistor disposed between the control terminal of the first bipolar transistor and the second power supply and having a control terminal connected to the base of the second bipolar transistor.

In the above described structure, since the third bipolar transistor has its control terminal connected to the control terminal of the second bipolar transistor, even when a potential of the control terminal of the second bipolar transistor rises insufficiently, the third bipolar transistor can be sufficiently and deeply turned on, thereby discharging the control terminal of the first bipolar transistor at a high speed to cause the first bipolar transistor to be turned off. Thus, a time period when both of the first and the second bipolar transistors are turned on is extremely reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 7A to 7D are diagrams showing circuit structures used in a simulation for explaining an effect of the Bi-CMOS logic circuit according to the present invention to a conventional Bi-CMOS logic circuit, wherein FIG. 7A shows a structure of an inverter for driving an input, FIG. 7B shows a conventional Bi-CMOS inverter circuit, FIG. 7C shows a Bi-CMOS inverter circuit according to the present invention and FIG. 7D shows a structure of still further Bi-CMOS inverter circuit of the present invention.

FIGS. 8A and 8B are diagrams showing the sumilation result of operational characteristics of the Bi-CMOS logic circuit shown in FIGS. 7A to 7C, wherein FIG. 8A shows an operation waveform during the fall of an output, and FIG. 8B shows a diagram illustrating an operation waveform during the rise of the output.

DESCRIPTION OF THE PREFERRED EMBODIMENTS

Figure 1:
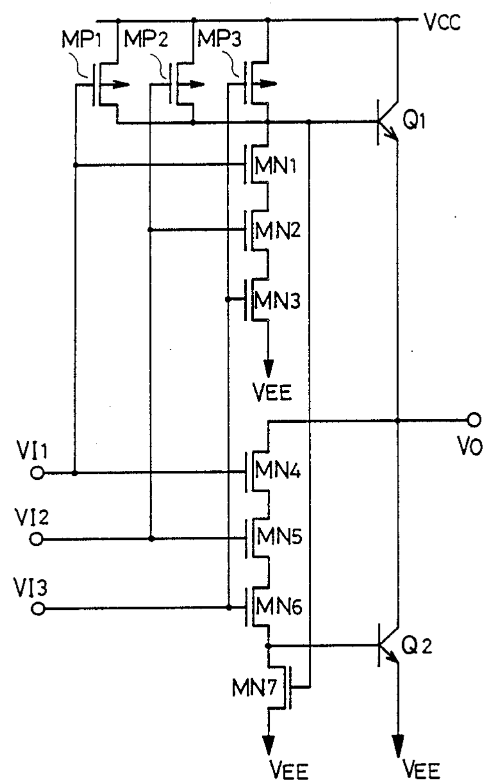
FIG. 1 is a diagram showing a structure of a conventional Bi-CMOS logic circuit.
Figure 2:
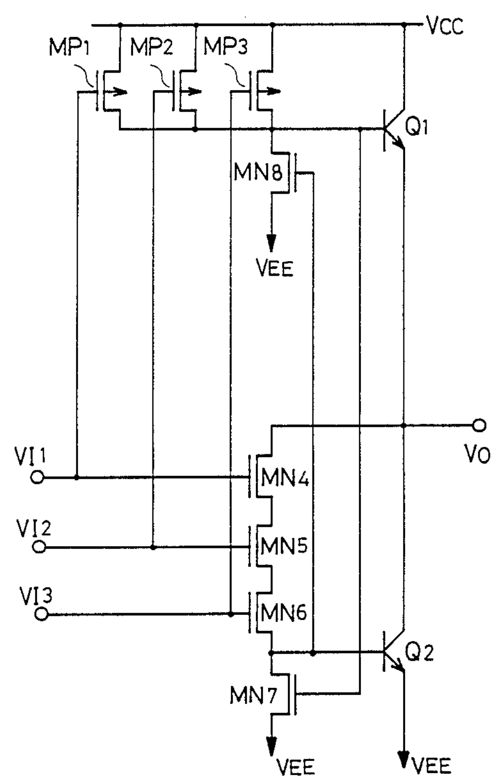
FIG. 2 is a diagram illustrating a structure of a further conventional Bi-CMOS logic circuit.
Figure 3:
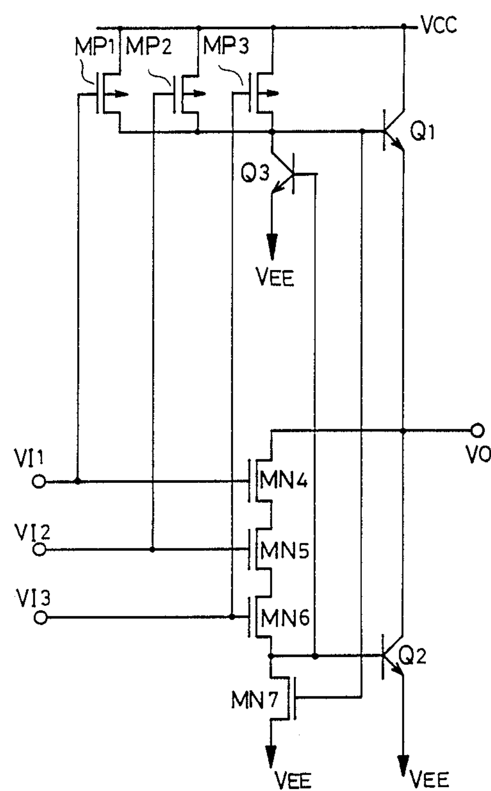
FIG. 3 is a diagram showing a structure of a Bi-CMOS logic circuit according to one embodiment of the present invention.

FIG. 3 shows a structure of a Bi-CMOS logic circuit according to one embodiment of the present invention. FIG. 3 shows a three-input NAND circuit as an example. In FIG. 3, the same reference numerals are allotted to the corresponding parts to those in the logic circuit shown in FIG. 2.

Referring to FIG. 3, the Bi-CMOS logic circuit according to one embodiment of the present invention comprises a third NPN bipolar transistor Q3 disposed between the base of the bipolar transistor Q1 for driving the output V0 and the power supply $V_{EE}$. The bipolar transistor Q3 has a collector connected to the base of the bipolar transistor Q1, an emitter connected to the power supply potential $V_{EE}$ and a base connected to the base of the second bipolar transistor Q2. The other parts of the structure are the same as those shown in FIG. 2. Now, the operation thereof will be described.

The output VO rises, when at least one of the inputs VI1–VI3 is at the "L" level. At this time, at least one of the PMOS transistors MP1–MP3 is turned on, while at least one of the NMOS transistors MN4–MN6 is turned off. Before the rise of the output VO, the base potential of the bipolar transistor Q2 is almost the same as that of the output VO because of the functions of the NMOS transistors MN4–MN6, whereby the bipolar transistor Q3 is turned off. Subsequently, the base of the bipolar transistor Q1 is charged from the power supply $V_{CC}$ through a PMOS transistor in on state, so that the base potential thereof rises. When the base potential of the bipolar transistor Q1 exceeds a threshold voltage of the NMOS transistor MN7, the NMOS transistor MN7 operating as impedance means is turned on, so that the base potential of the bipolar transistor Q2 is discharged, thereby causing the bipolar transistor Q1 to be turned on and the bipolar transistor Q2 to be turned off. As a result, the output VO is charged at a high speed through the bipolar transistor Q1 in on state, so that the potential of the output VO rises rapidly.

When the output VO falls, all of the inputs VI1–VI3 are made at the "H" level. At this time, all of the PMOS transistors MP1–MP3 are turned off and all of the NMOS transistors MN4–MN6 are turned on. In this case, the base potential of the bipolar transistor Q2 is charged from the output VO through the NMOS transistors MN4–MN6 in on state to rise, and the bipolar transistor Q2 and the bipolar transistor Q3 are turned on. Thereby, the base potential of the bipolar transistor Q1 is discharged through the bipolar transistor Q3 in on state, so that the base potential of the transistor Q1 falls and the bipolar transistor Q1 is turned off. As a result, the output VO is discharged through the bipolar transistor Q2 in on state and is raised rapidly.

As the foregoing, an input capacitance can be reduced by connecting the base of the transistor Q3 for drawing out base charge of the bipolar transistor Q1 is connected not to the input terminal but to the base of the bipolar transistor Q2. Thus, in a multi-input logic circuit, the transistor for drawing out base charge of the bipolar transistor Q1 can be structured by one element, which makes it possible to reduce the number of elements of a Bi-CMOS logic circuit and a layout area, so that a Bi-CMOS logic circuit suitable for high integration can be obtained.

In addition, since the transistor for falling a base potential of the bipolar transistor Q1 is structured by a bipolar transistor, when the output VO falls, the transistor Q3 for drawing out the base charge of the bipolar transistor Q1 is sufficiently and deeply turned on even if an amplitude of the base potential of the bipolar transistor Q2 is small, so that the bipolar transistor Q1 and the NMOS transistor MN7 can be reliably turned off, which makes it possible to minimize a time period when the bipolar transistors Q1 and Q2 are simultaneously turned on, so that power consumption of the Bi-CMOS logic circuit can be reduced.

Figure 4:
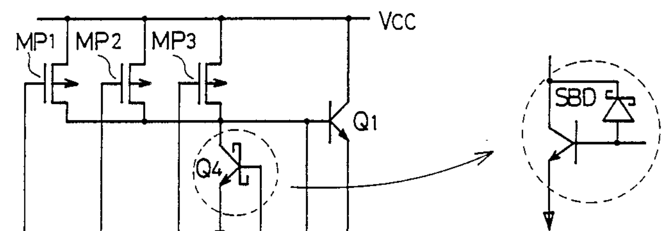
FIG. 4 is a diagram showing a Bi-CMOS logic circuit according to another embodiment of the present invention.
Figure 4A:
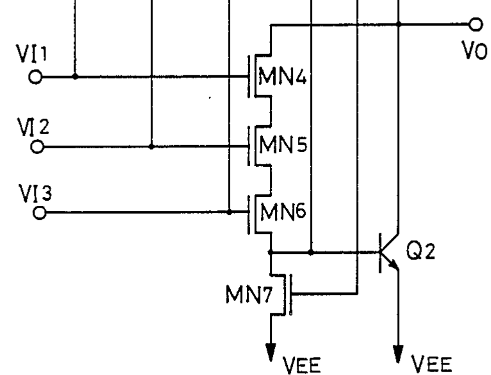

FIG. 4 shows a structure of a Bi-CMOS logic circuit according to another embodiment of the present invention. In the structure shown in FIG. 4, a Schottky clamp-type NPN bipolar transistor Q4 is used for drawing out base charge of the bipolar transistor Q1 used for driving the output. A base of the Schottky clamp-type NPN bipolar transistor Q4 is connected to the base of the bipolar transistor Q2. A Schottky clamp transistor has its base potential diode-clamped by a Schottky barrier diode SBD connected between its collector and its base. A Schottky clamp transistor has characteristics of high speed and low power consumption. Also in this structure, the base charge of the bipolar transistor Q1 can be drawn out at a high speed by the Schottky clamp-type bipolar transistor Q4, to obtain the same effects as those by the circuit structure shown in FIG. 3.

Figure 5:
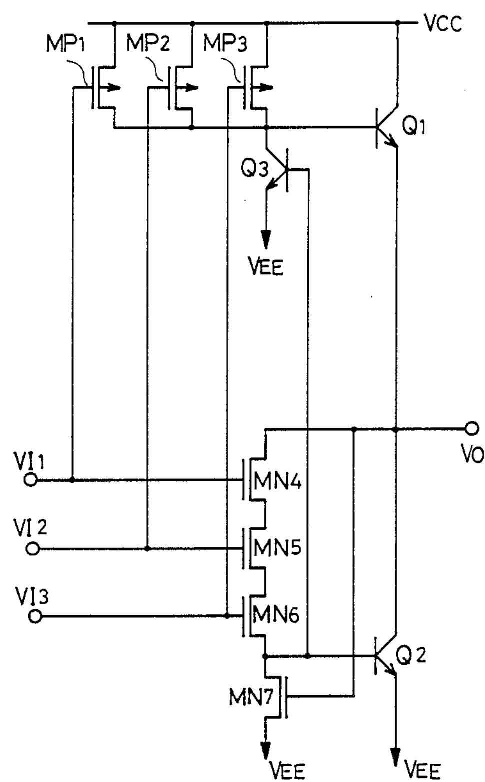
FIG. 5 is a diagram showing a structure of a Bi-CMOS logic circuit according to a further embodiment of the present invention.

FIG. 5 shows a structure of a Bi-CMOS logic circuit according to still another embodiment of the present invention. In the Bi-CMOS logic circuit shown in FIG. 5, the gate of the NMOS transistor MN7 for drawing out the base charge of the bipolar transistor Q2 is connected to the output VO. In the structure shown in FIG. 5, the NMOS transistor MN7, which operates as impedance means for applying a bias between the base and the emitter of the transistor Q2, is turned on when the output VO exceeds its threshold voltage $V_{th}$, to draw out the base charge of the bipolar transistor Q2. Thus, when the bipolar transistor Q2 is turned off, the output VO is charged at a high speed through the bipolar transistor Q1 in on state. The rise of the output VO causes the NMOS transistor MN7 to be more deeply turned on, and the bipolar transistor Q2 to be more deeply turned off. Thus, the output VO can be raised at a high speed and a time period when the bipolar transistors Q1 and Q2 are simultaneously turned on can be reduced, so that a current flowing from the power supply $V_{CC}$ to the power supply $V_{EE}$ can be reduced.

When the output VO falls, all of the NMOS transistors MN4–MN6 are made turned on, and the base potential of the bipolar transistor Q2 is raised by the charging from the output V0. The rise of the base potential of the bipolar transistor Q2 causes the bipolar transistor Q3 to be turned on and the bipolar transistor Q1 to be turned off at a high speed. When the output V0 falls due to the discharging through the bipolar transistor Q2 to be smaller than the threshold voltage of the NMOS transistor MN7, the NMOS transistor MN7 is turned off. The NMOS transistor MN7 has one conduction terminal receiving a voltage through on-resistances of the NMOS transistors MN4–MN6 from the output VO, and other conduction terminal connected to receive the power supply $V_{EE}$. Accordingly, when a source-gate voltage of the NMOS transistor MN7 is larger than the threshold voltage thereof, the NMOS transistor MN7 is in on state and draws out base charge of the bipolar transistor Q2, thereby reliably turning off the bipolar transistor Q2. However, it should be noted that if the source-gate voltage of the NMOS transistor NM7 is higher than the base-emitter voltage of the bipolar transistor Q2, the bipolar transistor Q2 remains in on state and keeps discharging of the output VO.

Figure 6:
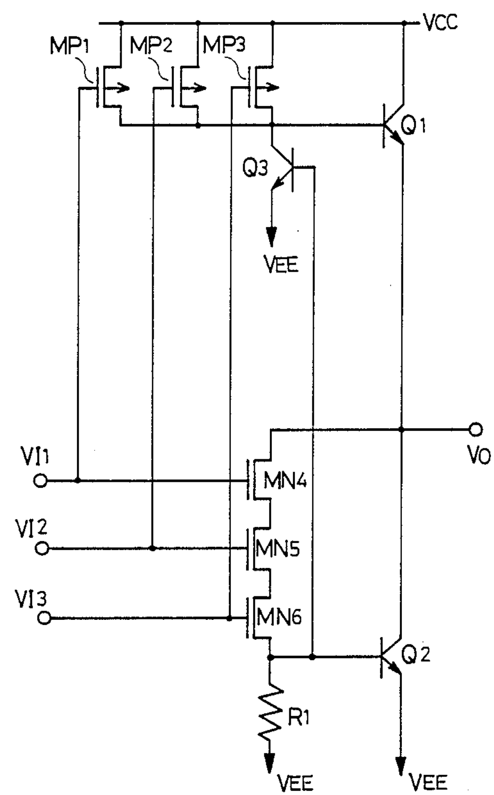
FIG. 6 is a diagram showing a structure of a Bi-CMOS logic circuit according to still another embodiment of the present invention.

FIG. 6 shows a structure of a Bi-CMOS logic circuit according to a still further embodiment of the present invention. In the structure shown in FIG. 6, a register R1 is used as impedance means for bias between the base and the emitter of the bipolar transistor Q2. More specifically, the register R1 is connected between the base of the bipolar transistor Q2 and the power supply $V_{EE}$. Also in this structure, the output VO rises and falls in the same manner as in the circuit structure shown in FIG. 3, and it is possible to turn on/off the bipolar transistors Q1 and Q2 at a high speed, minimize a penetrating current flowing from the power supply $V_{CC}$ to the power supply $V_{EE}$ and to perform a logical operation with a reduced power consumption without reducing a switching speed.

Now, operation characteristics of the Bi-CMOS logic circuit according to the present invention and a conventional Bi-CMOS logic circuit are compared in detail.

Figure 7A:
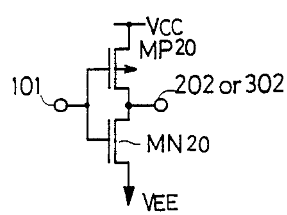
Figure 7B:
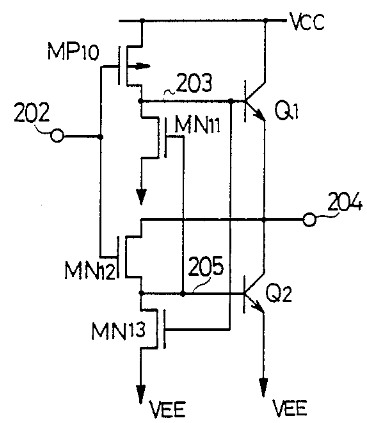
Figure 7C:
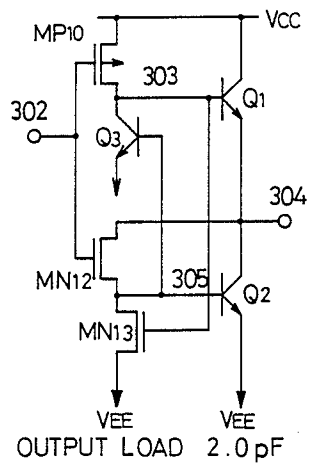

Now, it is assumed that a conventional Bi-CMOS logic circuit shown in FIG. 7B and a Bi-CMOS logic circuit according to the present invention shown in FIG. 7C each are driven by a CMOS inverter circuit shown in FIG. 7A. In FIG. 7A, the CMOS inverter is comprised of complementarily connected PMOS transistor MP20 and NMOS transistor MN20. An input signal VI to the Bi-CMOS logic circuit is provided by the inverter output.

The conventional Bi-CMOS logic circuit shown in FIG. 7B constitutes an inverter and comprises first and second bipolar transistors Q1 and Q2 for driving an output terminal 204, a PMOS transistor MP10 and an NMOS transistor MN12 for receiving an input signal from an input terminal 202, an NMOS transistor MN11 for drawing out a base charge of the bipolar transistor Q1, and an NMOS transistor MN13 for base bias of the bipolar transistor Q2. An output signal from the inverter in FIG. 7A is applied to the gates of the transistors MP10 and MN12 through the input terminal 202. A gate of the NMOS transistor MN11 is connected to a base of the bipolar transistor Q2. A gate of the NMOS transistor MN13 is connected to a base of the bipolar transistor Q1.

As shown in FIG. 7C, the Bi-CMOS logic circuit according to the present invention to be compared comprises output transistors Q1 and Q2, a PMOS transistor MP10 and an NMOS transistor MN12 for receiving a signal VI transmitted through an input terminal 302 at respective gates, a bipolar transistor Q3 for drawing out a base charge of the bipolar transistor Q1, and an NMOS transistor MN13 as an impedance for a base bias to the bipolar transistor Q2. A base of the bipolar transistor Q3 is connected to a base of the bipolar transistor Q2. A gate of the NMOS transistor MN13 is connected to a base of the bipolar transistor Q1.

Figure 8A:
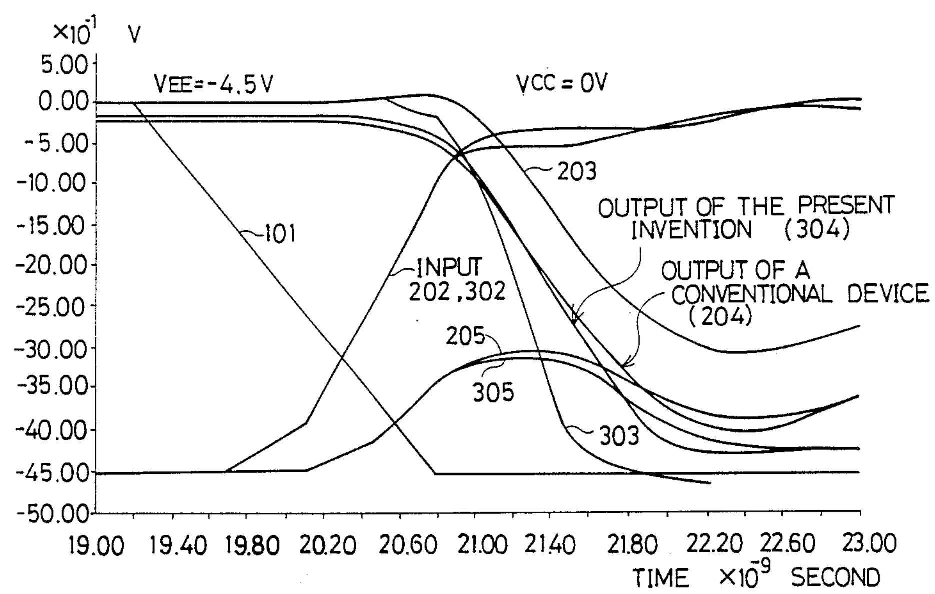
Figure 8B:
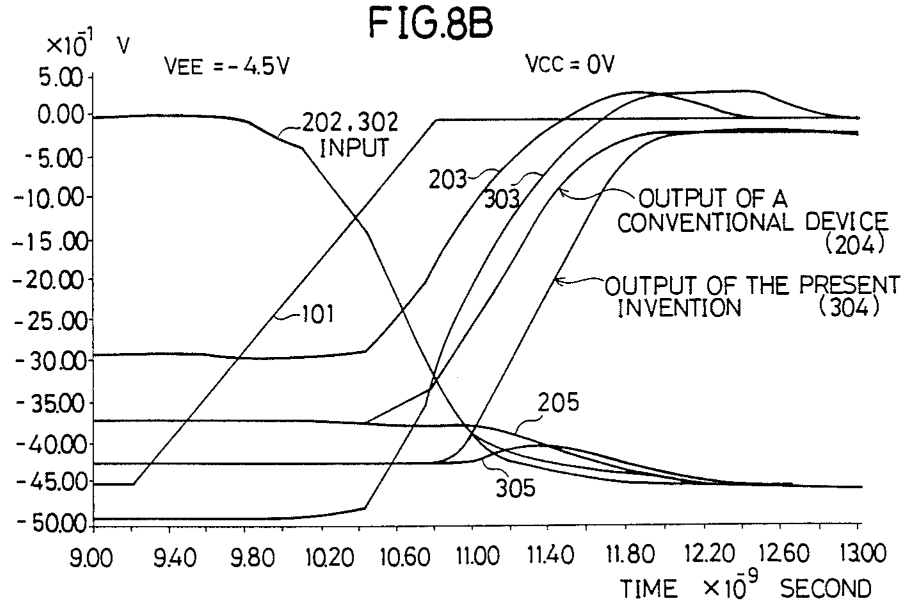

FIG. 8A and FIG. 8B show potential waveforms of each node when the circuit of FIG. 7B or FIG. 7C is operated, wherein FIG. 8A shows an operational waveform in the fall of the output terminal and FIG. 8B shows an operational waveform in the rise of the output, both of which are obtained from the simulation.

The following parameters are used in the above described simulation.

All of the gate lengths W of the PMOS transistors are 1.2 μm, and all of the gate lengths L of the NMOS transistors are set to 1.0 μm. A gate width of the PMOS transistor MP20 and a gate width of the NMOS transistor MN20 are set to 10 μm and 5 μm, respectively. A gate width of the PMOS transistor MP10 is set to 30 μm. The gate widths of the NMOS transistors MN11, MN12 and MN13 are set to 15 μm, 30 μm and 5 μm, respectively.

Emitter sizes of the bipolar transistor Q1, the bipolar transistor Q2 and the bipolar transistor Q3 are set to $1\times12\ \mu m^2$, $1\times10\ \mu m^2$ and $1\times2\ \mu m^2$, respectively.

The power supply $V_{EE}$ is set to −4.5V, and the other power supply $V_{CC}$ is set to 0V.

In FIG. 8A and FIG. 8B, a numeral given to each curve indicates a signal waveform at each node.

First referring to FIG. 8A, an operation of the rise of the output will be described. In a conventional Bi-CMOS logic circuit, a potential of a node 205 (the base of the bipolar transistor Q2) rises only by about 1V and a time period of the rise of the potential is short. Therefore the NMOS transistor MN11 is turned off before a node 203 (a base of the bipolar transistor Q1) is fully raised in potential, so that the bipolar transistor Q1 is turned off slowly, and accordingly the output node 204 falls slowly in potential. In addition, since the output node 204 falls slowly in potential, a potential of the node 205 falls slowly so that a time period when the bipolar transistor Q1 and the bipolar transistor Q2 are simultaneously turned on becomes longer. This state is a serious drawback in terms of a switching speed and a power consumption. This tendency is enhanced as the threshold voltage $V_{th}$ of a MOS transistor is larger and a power supply voltage $V_{EE}$ is smaller.

On the other hand, in the Bi-CMOS logic circuit according to the present invention, a node 305 (a base of the bipolar transistor Q2) rises in potential only by 1as in the prior art, however, it is enough to turn on the bipolar transistor Q3, so that it is possible to discharge a node 303 (a base of the bipolar transistor Q1) rapidly to fall its potential, whereby the bipolar transistor Q1 is turned off at a high speed, while an output node 304 is made to fall at a high speed through the bipolar transistor Q2 in on state. With this structure, the bipolar transistor Q3 is fully turned on even if its base voltage is small, and its drivability of electric charge is large, so that the node 303 can be discharged at a high speed.

In addition, even if the threshold voltage $V_{th}$ of the MOS transistor is large and the power supply voltage $V_{EE}$ is small so that a voltage amplitude at the node 305 is small, the bipolar transistor Q3 is reliably turned on whereby the circuit can be operated stably. As shown in FIG. 8A, since a potential of the node 303 is made to fall fully, the bipolar transistor Q1 can be reliably turned off, resulting in a reduced current consumption. On the other hand, in the conventional Bi-CMOS logic circuit, a potential of the node 203 falls only down to about −2.8V, so that the bipolar transistor Q1 cannot be reliably turned off and it is in a lightly on state.

Now, referring to to FIG. 8B, an operation for raising an output potential will be described. In the conventional Bi-CMOS logic circuit, since the input node 202 has already fallen in potential before the node 203 and the node 205 are made to fall fully, the output node 204 rises in potential relatively fast. However, there exists a time period when both of the bipolar transistors Q1 and Q2 are turned on (slightly turned on) before a potential of the node 205 fully falls, whereby current consumption is increased during that period.

On the other hand, in the Bi-CMOS logic circuit according to the present invention, since a potential of the node 303 is made to fall fully, the bipolar transistor Q1 is reliably turned off and since a potential of the node 305 is set low enough, as compared with that of the prior art, current consumption is sharply reduced, as compared with that of the prior art. In this case, however, since the potential of the node 303 is made to fall fully, the output node may rise in potential a little slowly, as compared with that of the prior art. However, even though the output rises a little slowly, the base potentials of the transistors Q1 and Q2 for outputting can be made to fall fully and the bipolar transistors Q1 and Q2 can be reliably turned off, so that a significant effect of significantly reducing a power consumption as compared with in the prior art can be obtained.

Figure 7D:
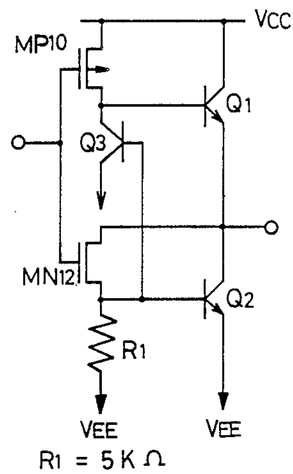

Almost the same operation waveform diagram as that of the Bi-CMOS logic circuit shown in FIG. 7C can be obtained when the register R1 is used as impedance means for base bias of the bipolar transistor Q2 and a resistance value of the register R is set to 5KΩ as shown in FIG. 7D.

As obvious from the above described simulation result, according to the Bi-CMOS logic circuit of the present invention, a power consumption can be significantly reduced as compared with a conventional device.

Although, in the above described embodiments, a three-input NAND circuit and an inverter circuit have been described, a logical circuit according to the present invention is not limited to those, but the number of the inputs thereof may be more or less than three, and in addition, the same effect as that of the above described embodiments can be obtained in other logical circuits such as an NOR circuit as a logical circuit.

As described in the foregoing, according to the present invention, in a Bi-MOS circuit comprising first and second bipolar transistors for outputting, a bipolar transistor is used for drawing out base charge of the first bipolar transistor, and a base of that bipolar transistor is connected to a base of the second bipolar transistor, so that a Bi-CMOS logic circuit can be obtained by which a multi-input logic circuit having a small input capacitance, reduced number of elements, a reduced layout area, a high speed and a reduced power consumption can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A Bi-MOS logic circuit having at least one bipolar transistor and at least one insulated gate type field effect transistor, comprising:

a first bipolar transistor of a first conductivity type having a first conduction terminal connected to a first power supply potential, a second conduction terminal connected to an output terminal, and a control terminal, a second bipolar transistor of said first conductivity type having a first conduction terminal connected to said output terminal, a second conduction terminal coupled to a second power supply potential, and a control terminal, at least one insulated gate type field effect transistor of the first conductivity type disposed between said first power supply potential and said control terminal of said first bipolar transistor, an input signal being applied to a gate of said one insulated gate type field effect transistor of said first conductivity type, at least one insulated gate type field effect transistor of a second conductivity type disposed between said first conduction terminal and said control terminal of said second bipolar transistor, said input signal being applied to a gate of said one insulated gate type field effect transistor of said second conductivity type, impedance means disposed between said control terminal and said second conduction terminal of said second bipolar transistor, for setting a potential of said control terminal of said second bipolar transistor to said second power supply potential when said first bipolar transistor is conductive, and a third bipolar transistor disposed between said control terminal of said first bipolar transistor and said second power supply potential and having its control terminal connected to said control terminal of said second bipolar transistor.

2. A Bi-MOS logic circuit according to claim 1, wherein said first, second and third bipolar transistors are formed of the same conductivity type of bipolar transistors.

3. A Bi-MOS logic circuit according to claim 1, wherein said third bipolar transistor is a Schottky diode-clamped transistor.

4. A Bi-MOS logic circuit according to claim 1, wherein said impedance means comprises a third insulated gate filed effect transistor having a control terminal connected to said control terminal of said first bipolar transistor, one conduction terminal connected to said control terminal of said second bipolar transistor and another conduction terminal connected to receive said second power supply potential.

5. A Bi-MOS logic circuit according to claim 4, wherein said first insulated gate type field effect transistor and said second insulated gate type field effect transistor are of opposite conductivity types to each other, and said second insulated gate type field effect transistor and said third insulated gate type field effect transistor are of the same conductivity type.

6. A Bi-MOS logic circuit according to claim 1, wherein said third bipolar transistor having a first conduction terminal connected to said control terminal of said first bipolar transistor and a second conduction terminal coupled to said second power supply potential each of said second conduction terminals of said first, second and third bipolar transistors comprises an emitter region, occupation areas of said emitter regions of said first and second bipolar transistors being substantially the same while larger than an occupation area of said emitter region of said third bipolar transistor.

7. A Bi-MOS logic circuit according to claim 4, wherein said second insulated gate type field effect transistor and said third insulated gate type field effect transistor are of the same conductivity type, and a ratio of conductances of said second insulated gate type field effect transistor and said third field insulated gate type field effect transistor is set approximately to 6:1.

8. A Bi-MOS logic circuit according to claim 6, wherein occupation areas of said emitter regions of said first and second bipolar transistors are set substantially six times that of said third bipolar transistor.

9. A Bi-MOS logic circuit according to claim 1, wherein said respective control terminals of said first, second and third insulated gate field effect transistors comprise gate regions having a width of W and a length of L, and a ratio between a width and a length W/L of each gate region of said first, second and third insulated gate type field effect transistor is substantially 30/1.2:30:5.

* * * * *